United States Patent
Wang

(10) Patent No.: US 9,786,524 B2
(45) Date of Patent: Oct. 10, 2017

(54) DEVELOPING UNIT WITH MULTI-SWITCH EXHAUST CONTROL FOR DEFECT REDUCTION

(71) Applicant: Taiwan Semiconductor Manufacturing Company, Ltd., Hsin-Chu (TW)

(72) Inventor: Chung-Cheng Wang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 310 days.

(21) Appl. No.: 14/253,455

(22) Filed: Apr. 15, 2014

(65) Prior Publication Data
US 2015/0294862 A1 Oct. 15, 2015

(51) Int. Cl.
| | | |
|---|---|---|
| H01L 21/02 | (2006.01) |
| H01L 21/67 | (2006.01) |
| G03F 7/30 | (2006.01) |
| B05C 5/00 | (2006.01) |
| H01L 21/687 | (2006.01) |

(52) U.S. Cl.
CPC ...... *H01L 21/67051* (2013.01); *G03F 7/3021* (2013.01); *H01L 21/67253* (2013.01); *B05C 5/00* (2013.01); *H01L 21/68792* (2013.01)

(58) Field of Classification Search
USPC ....... 251/305, 315.01; 118/52, 56, 319, 320, 118/50; 438/5; 427/240; 134/902
See application file for complete search history.

(56) References Cited

U.S. PATENT DOCUMENTS

| | | | | |
|---|---|---|---|---|
| 5,766,671 A * | 6/1998 | Matsui | ................... | B05D 1/005 118/52 |
| 6,159,541 A * | 12/2000 | Sakai | ..................... | B05D 1/005 118/52 |
| 6,170,492 B1 * | 1/2001 | Ueda | ................. | H01J 37/32935 134/1.1 |
| 2002/0037684 A1 * | 3/2002 | Yamamoto | .............. | B24B 37/04 451/41 |
| 2004/0053147 A1 * | 3/2004 | Ito | ......................... | G03F 7/3021 430/30 |
| 2004/0072450 A1 * | 4/2004 | Collins | .................... | G03F 7/162 438/782 |
| 2007/0175500 A1 * | 8/2007 | Hohenwarter | .... | H01L 21/67051 134/149 |
| 2008/0050538 A1 * | 2/2008 | Hirata | ................. | C23C 16/4412 427/585 |

* cited by examiner

*Primary Examiner* — Laura Edwards
(74) *Attorney, Agent, or Firm* — Haynes and Boone, LLP

(57) ABSTRACT

The present disclosure provides a developing unit that includes a wafer stage designed to secure a semiconductor wafer; an exhaust mechanism configured around the wafer stage and designed to exhaust a fluid from the semiconductor wafer; and a multi-switch integrated with the exhaust mechanism and designed to control the exhaust mechanism at various open states.

20 Claims, 8 Drawing Sheets

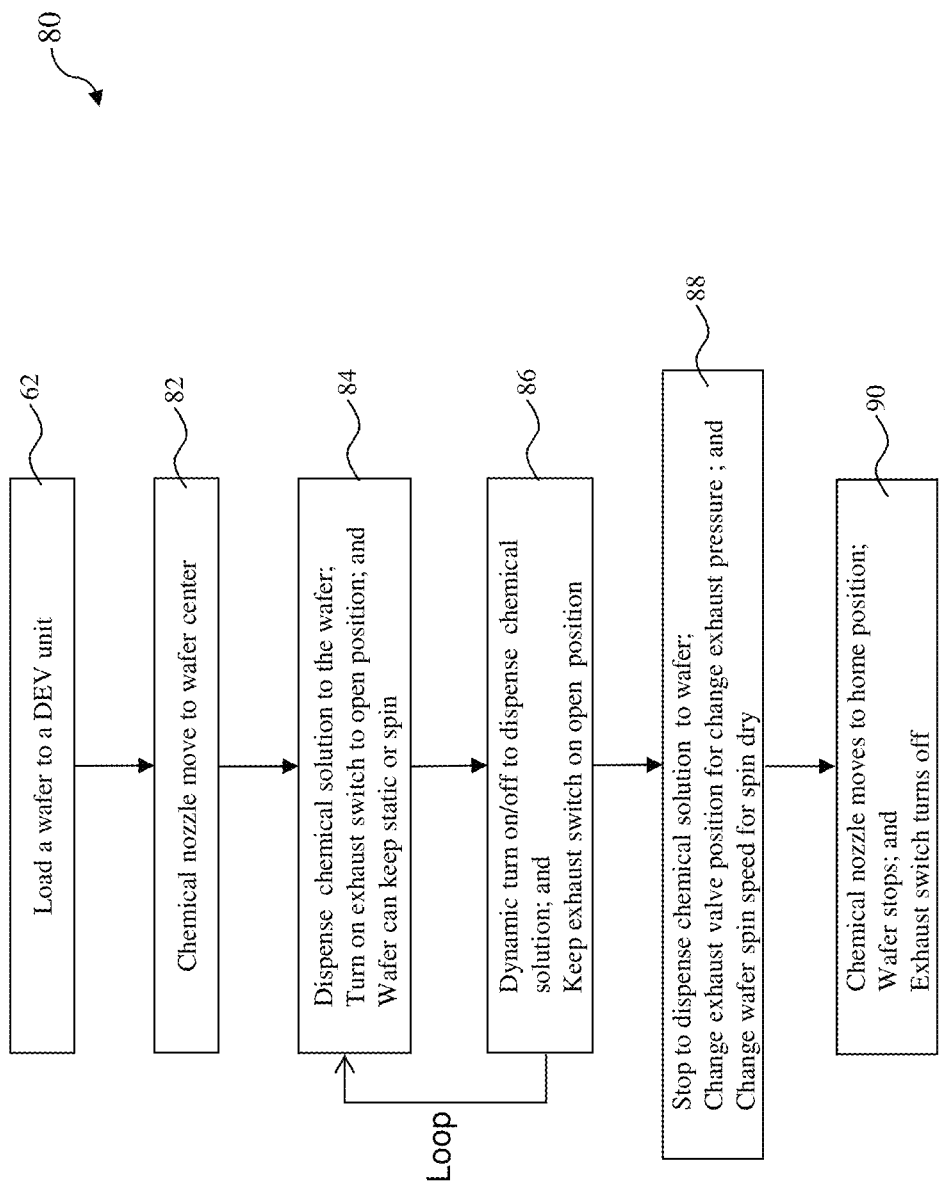

DEVELOPING UNIT WITH MULTI-SWITCH EXHAUST CONTROL FOR DEFECT REDUCTION

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of IC processing and manufacturing. For these advances to be realized, similar developments in IC processing and manufacturing are needed. For example, a developing process is applied to an exposed photoresist layer to form a patterned photoresist. However, the existing developing system causes defects on wafer edges. Especially, during wafer spin dry process, spin induces high exhaust pressure on wafer edge, where high exhaust pressure on wafer edge dries out the fluid before being spun off. Therefore, a structure of the developing system and a method utilizing the developing system are desired to address the above issues.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 is a flowchart of a method, constructed in accordance with some embodiments.

DETAILED DESCRIPTION

Figure 1:
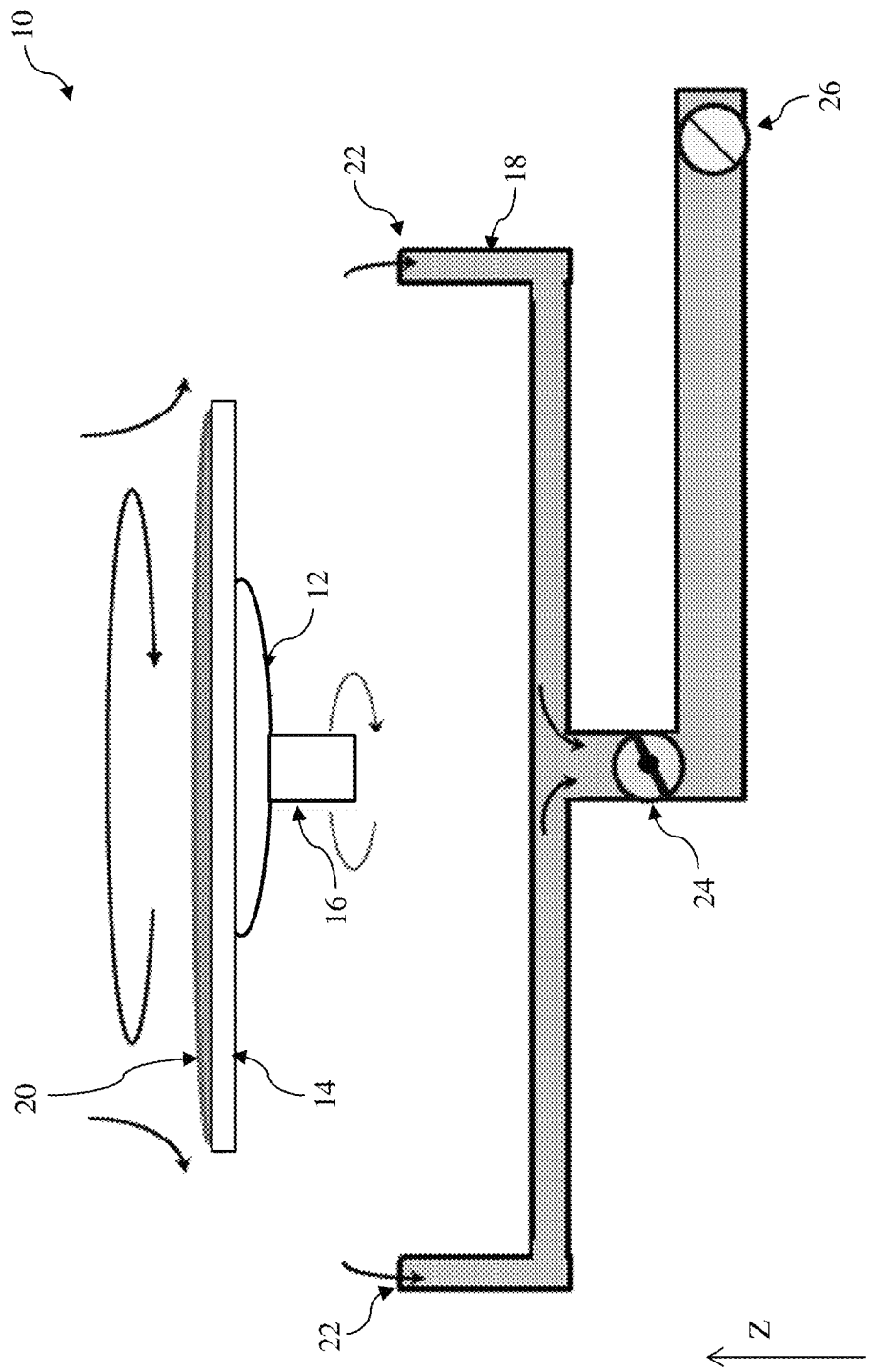
FIG. 1 is a schematic view of a developing unit with an exhaust multi-switch, constructed in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a schematic view of a developing unit (or DEV unit) 10, constructed in accordance with some embodiments. The developing unit 10 is designed to perform a developing process during lithography patterning. The lithography patterning includes resist coating, exposing and developing. The lithography patterning may further include other operations, such as various baking including post-exposure baking (PEB). The developing unit 10 is operable to apply a developing process to an exposed resist layer coated on a wafer.

The developing unit 10 includes a substrate stage 12 designed to retain a substrate 14 to be patterned. The substrate 12 is coated with a resist layer. The substrate stage 12 is operable to spin such that the substrate 14 secured thereon is spun accordingly during the developing process. The substrate stage 12 includes a mechanism, such as vacuum suction mechanism or other suitable mechanism, to secure the substrate 14. In the present embodiments, the substrate 14 is a semiconductor wafer, such as a silicon wafer. In some embodiments, the substrate 14 is a wafer having other semiconductor material, such as silicon germanium layer epitaxy grown on a silicon wafer or a compound semiconductor layer epitaxy grown on a sapphire wafer. In some embodiments, the substrate 12 may include other suitable substrate to be patterned by the lithography patterning.

The developing unit 10 further includes a motion mechanism 16 integrated with the substrate stage 12 and is operable to drive the substrate stage 12 and the substrate 14 secured thereon in various motion modes. In some embodiments, the motion mechanism 16 includes a motor to drive the substrate stage 12 and the substrate 14 to spin at a certain spin speed during various operations (such as developing and rinsing). In some embodiments, the motion mechanism 16 includes an elevation module to move the substrate 14 secured on the substrate stage 12 along the vertical direction (Z direction as illustrated in FIG. 1). Thereby, the substrate 14 is able to be positioned at a lower or higher level.

The developing unit 10 also includes an exhaust mechanism 18 configured near the substrate stage 12 and designed to provide an exhaust path to a liquid 20 that is spun off from the substrate 14 during the developing process. In some embodiments, the exhaust mechanism 18 includes a pipeline structure made of one or more suitable material. In some embodiments, the exhaust mechanism 18 may further include separate passages for liquid and gas, respectively.

The developing unit 10 also includes a cup 22 integrated with the exhaust mechanism 18 and configured around the substrate stage 12. In some embodiments, the cup 22 is designed to have a cylinder structure and is configured to effectively catch the liquid 20 spun off from the substrate 14 during the developing process. The cup 22 is integrated with the exhaust mechanism 18 such that the liquid received from the cup is sent out through the exhaust mechanism 18.

Especially, the developing unit 10 includes an exhaust multi-switch (or simply multi-switch) mechanism 24 integrated in the exhaust mechanism 18. The multi-switch mechanism 24 is designed to have a closed state and multiple open states. The multiple open states correspond to various open thresholds for the exhaust liquid flowing, ranging from the closed state to a fully open state. If the closed state is represented by "0" and the fully open state is represented by "1", then various open states range from "0" to "1", not including "0". For example, if one open state is 0.5, it stands for the open threshold is 50% of that of the fully open state. The multi-switch mechanism 24 is operable to be set to the closed state or one of the open states, thereby dynamically controlling the exhaust mechanism 18 for different open thresholds. Accordingly, the exhaust rate is controlled dynamically and is operable to be maintained to a certain level.

Figure 2:
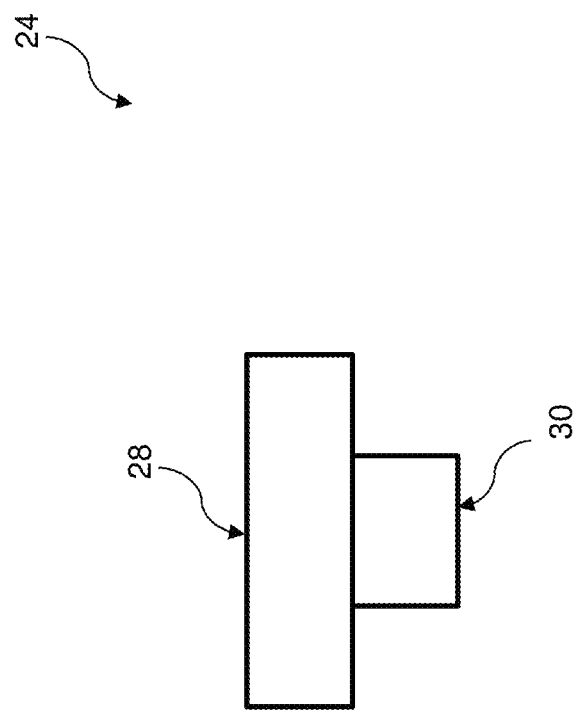
FIG. 2 is a diagrammatical view of the exhaust multi-switch integrated in the developing unit of FIG. 1, constructed in accordance with some embodiments.

In some embodiments, the multi-switch mechanism 24 includes a multi-switch valve, such as a circle valve. The circle valve is fixed in center and is operable to be rotated for different open thresholds, ranging from "0" to "1". As further illustrated in FIG. 2 in a diagrammatic view, the multi-switch mechanism 24 includes a circle valve 28 and a driving mechanism 30, such as a stepper motor, mechanically coupled with the circle valve 28. The stepper motor controls the circle valve 28 to be rotated to one of the closed state and the multiple open states at a time. Particularly, the circle valve 28 is dynamically controlled by the stepper motor so that the circle valve is able to change from one open state to another state dynamically during the developing process.

The developing unit 10 may further include a source exhaust adjusted to a total exhaust value. In some embodiments, the total exhaust value is only adjusted in the idle time between the developing processes, such as manually adjusted. During a developing time, it is not dynamically tunable according to the processing recipe.

Figure 3:
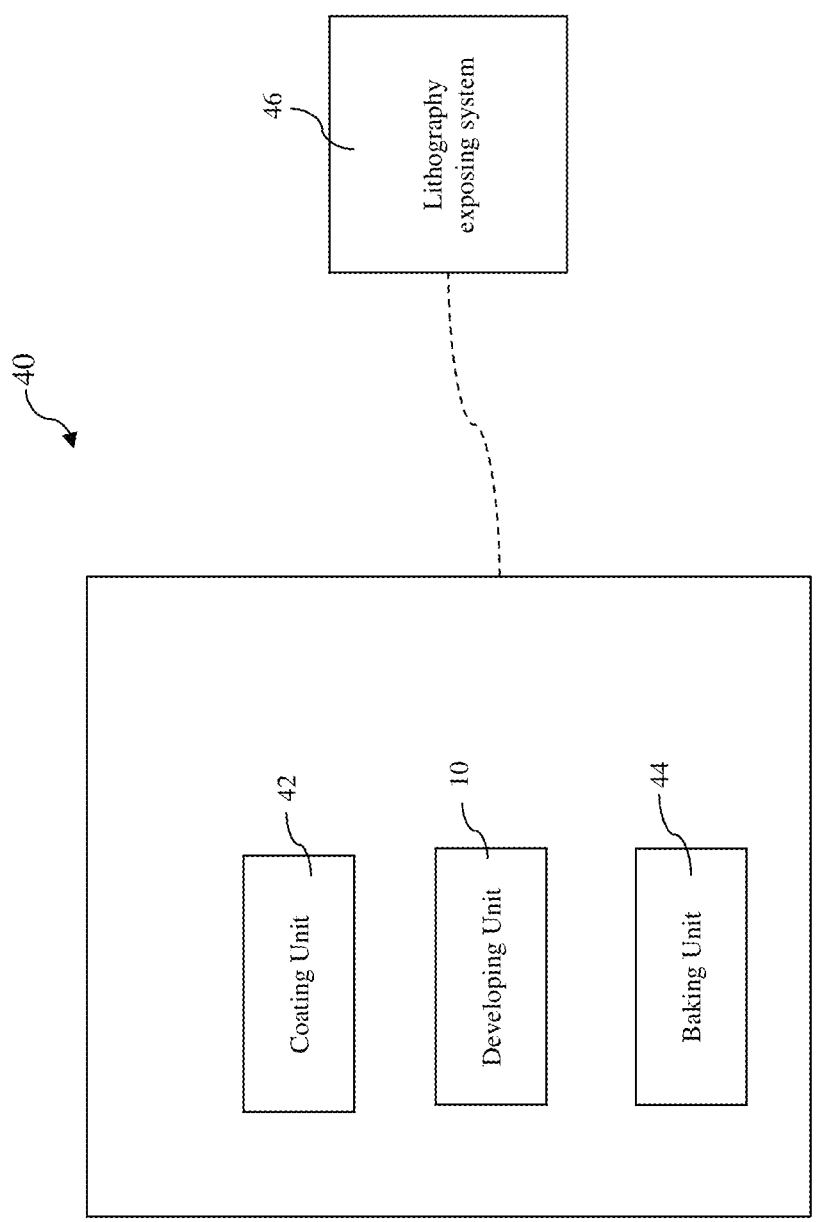
FIG. 3 is a block diagram of a lithography track having the developing unit of FIG. 1, constructed in accordance with some embodiments.

FIG. 3 is a block diagram illustrating a processing system 40 including the developing unit 10. The process system 40 is a cluster tool having multiple processing units integrated together to provide various processing operations, such as coating, developing and baking. The processing system 40 includes one or more developing unit 10. In some embodiments, the processing system 40 includes one or more coating unit 42 designed to coating a resist layer to a substrate (such as a semiconductor wafer). In some embodiments, the processing system 40 includes one or more baking unit 44 designed to perform a thermal baking process (such as soft baking, post-exposure baking or hard baking) to the resist layer coated on the substrate. The processing system 40 may further include other components integrated with the other units. In some embodiments, the processing system 10 includes a wafer transfer mechanism, such as one or more robot arm, designed to transfer wafers into the system 40, out of the system, and/or among different processing units.

In some embodiments, the processing system 40 is further coupled with a lithography exposing system 46 such that one wafer or a set of wafers is transferred therebetween. The lithography exposing system 46 is a tool designed to perform a lithography exposing process to the resist layer coated on the wafer. In some embodiments, the lithography exposing system 46 includes a radiation source to deliver a radiation energy, a mask stage to hold a mask having an integrated circuit pattern defined thereon, a wafer stage to hold a wafer, and an optical sub-system deigned to image the IC pattern of the mask to the resist layer coated on the wafer using the radiation energy. The radiation energy may include ultraviolet (UV) light, deep UV or extreme UV or other suitable radiation energy. In other embodiments, the lithography exposing system 40 is an electron-beam system to form an IC pattern on the resist layer by direct e-beam writing.

Figure 4:
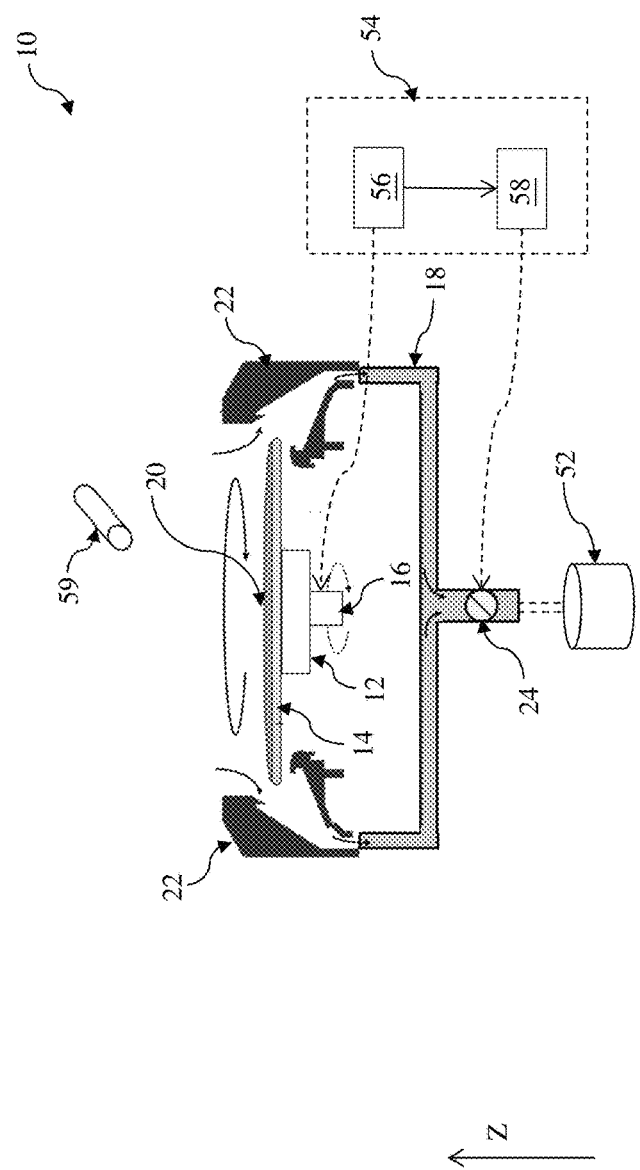
FIG. 4 is a schematic view of a developing unit with an exhaust multi-switch, constructed in accordance with some other embodiments.

FIG. 4 is a schematic view of a developing unit 10, constructed in accordance with some other embodiments. The developing unit 10 is designed to perform a developing process. The developing unit 10 includes a substrate stage 12 designed to retain a substrate 14 to be patterned. The substrate 12 is coated with a resist layer. The substrate stage 12 is operable to spin such that the substrate 14 secured thereon is spun accordingly during the developing process. The substrate stage 12 includes a mechanism, such as vacuum suction mechanism or other suitable mechanism, to secure the substrate 14. A resist layer 20 is coated on the substrate 14.

The developing unit 10 further includes a motion mechanism 16 integrated with the substrate stage 12 and is operable to drive the substrate stage 12 and the substrate 14 secured thereon in various motion modes. In some embodiments, the motion mechanism 16 includes a spin motor to drive the substrate stage 12 and the substrate 14 to spin at a certain spin speed for various operations (such as developing and rinsing) during the developing process. In some embodiments, the motion mechanism 16 includes an elevation module to move the substrate 14 secured on the substrate stage 12 along the vertical direction (Z direction). Thereby, the substrate 14 is able to be positioned at a suitable level.

The developing unit 10 also includes an exhaust mechanism 18 configured near the substrate stage 12 and designed to provide an exhaust path to the liquid that is spun off from the substrate 14 during the developing process. In some embodiments, the exhaust mechanism 18 includes a pipeline structure made of one or more suitable material. In some embodiments, the exhaust mechanism 18 may further include separate passages for liquid and gas, respectively.

The developing unit 10 also includes a cup 22 integrated with the exhaust mechanism 18 and configured around the substrate stage 12. In some embodiments, the cup 19 is designed to have a suitable structure and is configured to effectively catch the liquid spun off from the substrate 14 during the developing process. The cup 22 is integrated with the exhaust mechanism 18 such that the liquid received from the cup 22 is sent out through the exhaust mechanism 18.

Especially, the developing unit 10 includes an exhaust multi-switch (or multi-switch) mechanism 24 integrated in the exhaust mechanism 18. The multi-switch 24 is designed to have a closed state and multiple open states. The multiple open states correspond to various open thresholds for the exhaust liquid flowing, ranging from the closed state to a fully open state. The multi-switch mechanism 24 is operable to be set to the closed state or one of the open states, thereby dynamically controlling the exhaust mechanism 18 for different open thresholds. Accordingly, the exhaust rate is controlled dynamically and is operable to be maintained to a certain level.

In some embodiments, the multi-switch mechanism 24 includes a multi-switch valve, such as a circle valve. The circle valve is fixed in center and is operable to be rotated for different open thresholds. In some embodiments, the multi-switch mechanism 24 includes the circle valve and a driving mechanism, such as a stepper motor, mechanically coupled with the circle valve. The circle valve is dynamically controlled by the stepper motor so that the circle valve is able to change from one open state to another state dynamically during the developing process.

The exhaust mechanism 18 may be further coupled with other components. In some embodiments, the exhaust mechanism 18 is coupled with a vacuum pump 52 such that the liquid received from the cup is able to be removed from the developing unit 10 under a certain pressure difference. In some embodiments, the exhaust mechanism 18 is coupled with a source exhaust to adjust the total exhaust value.

The developing unit 10 further includes a controller 54 designed to control various modules of the developing unit 10 and coupled with those modules, such as motion mechanism 16 and the multi-switch mechanism 24. The controller 54 includes circuits and algorithm integrated to be functional to control the corresponding modules. In some embodiments, the controller 54 includes a spin controller 56 coupled with the motion mechanism 16 and designed to control the motion of the substrate stage 12. Particularly, the spin controller 56 controls the spinning motion of the substrate 14 secured on the substrate stage 12, including starting the spinning or stopping the spinning. The spin controller 56 further controls the corresponding spinning speed of the substrate 14 according to the respective processing recipe. The spin controller 56 sends a spinning signal to the motion mechanism 16 (such as the spin motor) for controlling the spin speed.

In some embodiments, the controller 54 includes a multi-switch controller 58 coupled with the multi-switch mechanism 24 and designed to set the multi-switch mechanism 24 to respective one of the multiple switch states that include closed state and multiple open states. Particularly, the multi-switch controller 58 is coupled with the spin controller 56 such that a spinning signal of the spin controller 56 is also an input to the multi-switch controller 58. Thereby, the multi-switch controller 58 controls the multi-switch mechanism 24 to one switch state according to the spinning signal of the spinning controller 56. In the present embodiment, the multi-switch controller 58 is directly coupled with the stepper motor of the multi-switch 24 mechanism.

The developing unit 10 also includes a chemical supply mechanism 59 designed to provide one or more chemicals to resist layer 20 coated on the substrate 14. In some embodiments, the chemical supply mechanism 59 includes one or more spray nozzle (or chemical nozzle) connected to the respective chemical source and designed to deliver the corresponding chemical to the substrate 14. In some examples, the chemical supply mechanism 59 includes a first spray nozzle to deliver a developing solution and a second spray nozzle to deliver a rinsing solution, such as de-ionized water (DIW).

Figure 5:
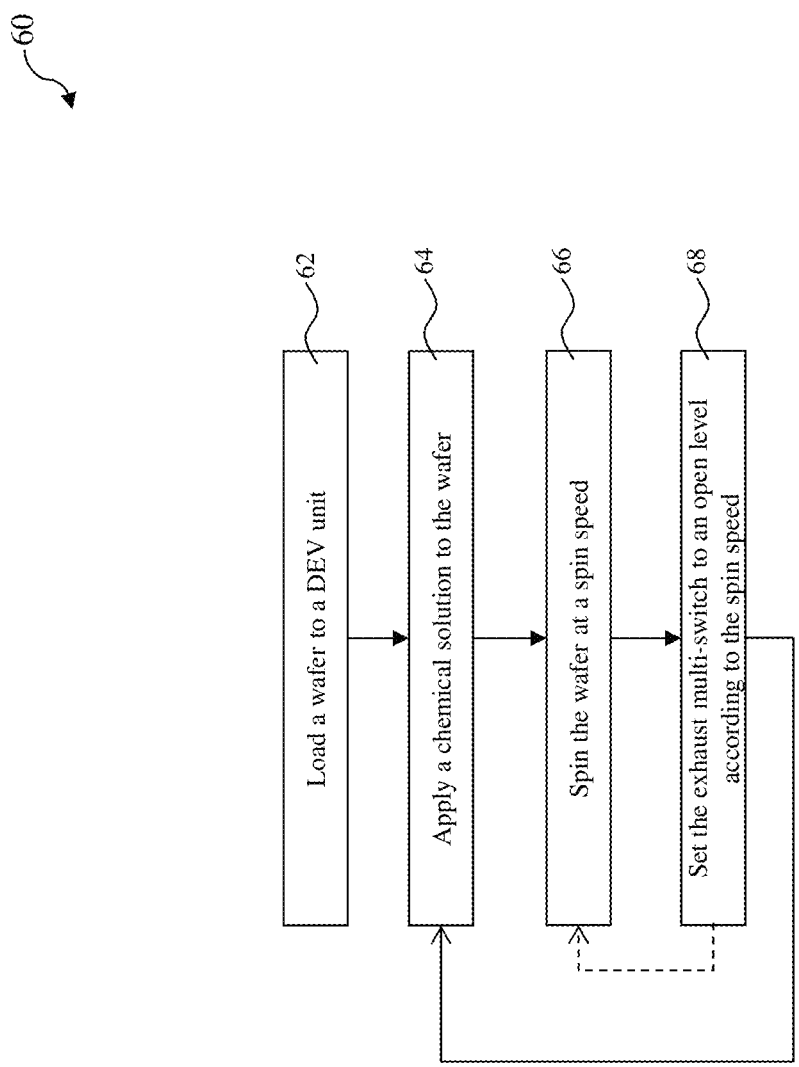
FIG. 5 is a flowchart of a method for developing a resist layer, constructed in accordance with some embodiments.

FIG. 5 is a flowchart of a method 60 for a developing process, constructed in accordance with some embodiments. The method 60 is described with reference to FIG. 5 and other figures, such as, FIGS. 1, 4 and 6. The method 60 includes an operation 62 by loading a substrate 14 to the developing unit 10. Particularly, the substrate 14 is loaded to the substrate stage 12 of the developing unit 10. In the present embodiment, the substrate 14 is a semiconductor wafer coated with a resist layer sensitive to the radiation energy. In furtherance of the embodiment, the resist layer is coated on the top surface of the substrate 14.

The method 60 further includes an operation 64 by applying a chemical solution to the substrate 14 by the chemical supply mechanism 59 of the developing unit 10. In some embodiments, the chemical to be delivered is a developing solution, such as tetramethyl ammonium hydroxide (TMAH).

Figure 6:
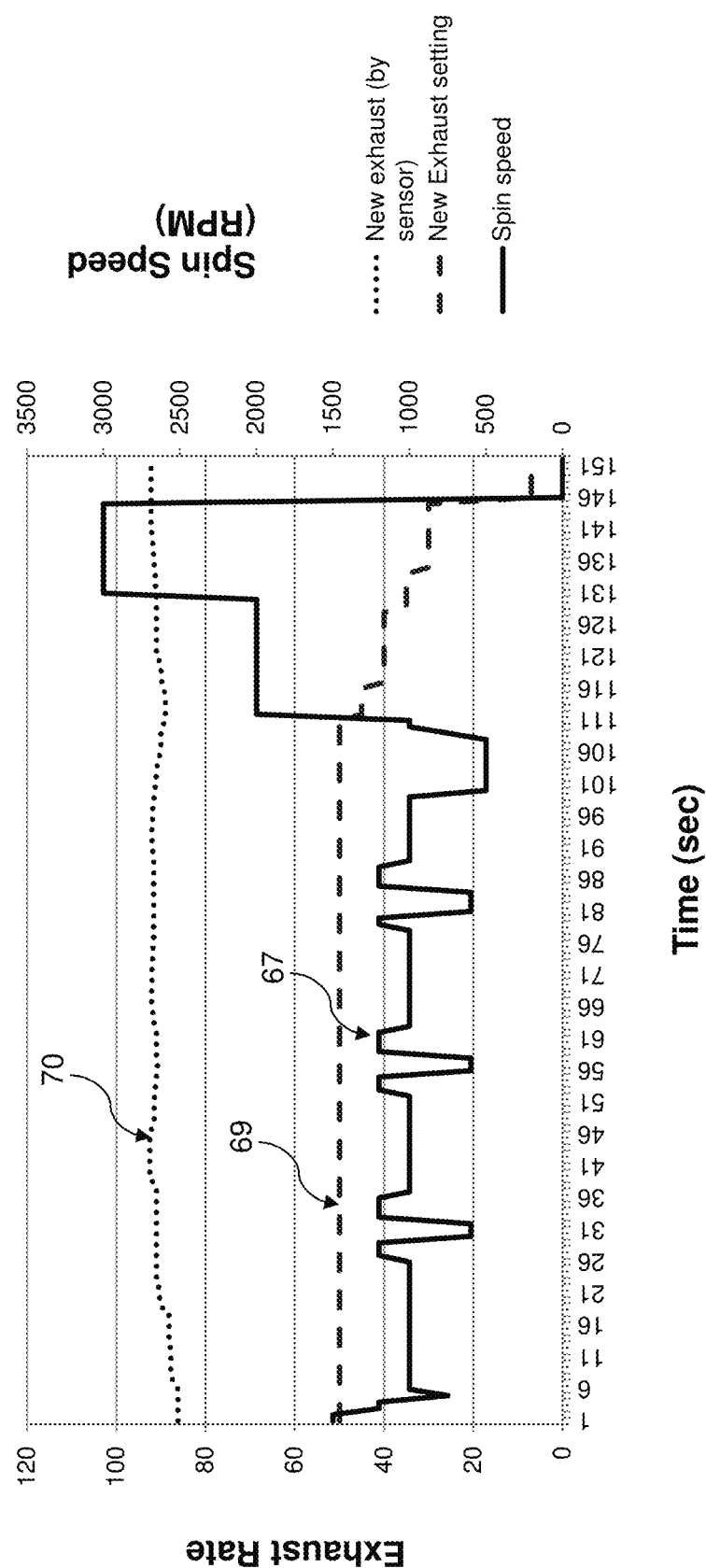
FIG. 6 is diagrammatic view illustrating various parameters of the developing process over processing time, constructed in accordance with some embodiments.

The method 60 further includes an operation 66 by spinning the substrate 14 secured on the substrate stage 12 through the motion mechanism 16. In some embodiments, the operation 66 is overlapped with the operation 64 for applying the chemical to the substrate 14. The substrate 14 is controlled to spin at a certain spin speed by the spin controller 24. In some embodiment, the spin speed is a variable that dynamically varies through the operation 66 such that the corresponding developing process is enhanced. The spin speed is a function of the processing time. In some embodiments, the spin speed is controlled to vary according to a corresponding processing recipe. FIG. 6 is one example of the operation 66 for illustration. The horizontal axis represents the processing time in a proper unit, such as second. For the vertical axis, the right side numbers represent the spin speed in a proper unit, such as revolutions per minute (RPM), and the left side numbers represent the exhaust rate in a proper unit, such as "pa". The curve 67 represents the spin speed over the processing time. In some embodiments, the spin speed is controlled by the spin motor 16, which is further controlled by the spin controller 56 according to the corresponding processing recipe that includes spin speed over processing time.

The method 60 also includes an operation 68 by turning the exhaust multi-switch mechanism 24 to one switch open state according to the spin speed. As the exhaust multi-switch mechanism 24 has multiple switch open states, it can be set to one of the switch open states. Furthermore, the setting of the multi-switch mechanism 24 is not fixed and is dynamically changed according to the spin speed so that to maintain the exhaust rate substantially stable with less variation. The operations 66 and 68 are implemented simultaneously and the setting of the exhaust multi-switch mechanism 24 is a function of the spin speed. Especially, when the spin speed is increased, the exhaust multi-switch mechanism 24 may be set to a switch open state with less valve threshold. When the spin speed is decreased, the exhaust multi-switch mechanism 24 may be set to a switch open state with greater valve threshold.

As illustrated in FIG. 6, the setting of the multi-switch mechanism 24 over the processing time is represented by a curve 69, which corresponds to the spin speed profile 67 in the present example. In this example, for a first stage where the spin speed 67 varies in a certain range, the setting of the exhaust multi-switch mechanism 24 remains at a same open state. Afterward, the spin speed 67 increases dramatically in a step-wise mode, the setting of the exhaust multi-switch 24 changes to switch open states with less valve thresholds. Accordingly, the corresponding exhaust rate is illustrated in a curve 70. The exhaust rate 70 remains substantially stable with variations in a tolerable range.

In some embodiments, the open state of the multi-switch mechanism 24 is controlled by the stepper motor 30, which is further controlled by the multi-switch controller 58 according to the spin speed of the substrate 14 defined in the corresponding processing recipe. In furtherance of the embodiments, the multi-switch controller 58 take an output of the spin controller 56 (that is associated with the spin speed) as the input and determines the signal to the stepper motor 30 accordingly. In other embodiments, the relationship between the spin speed and the switch open state is not one to one. A certain range of the spin speed corresponds to one switch open state. In other words, the switch open state as a function of the spin speed is a step-wise function designed to reduce the variation of the exhaust rate.

The relationship of the operations 66 and 68 is also illustrated in the flowchart of FIG. 4 as a loop. When the wafer spins at a first spin speed in the operation 66, the exhaust multi-switch mechanism 24 is set to a first switch open state. When the wafer spins at a second spin speed in the operation 66, the exhaust multi-switch mechanism 24 is set to a second switch open state. This procedure continues to a third spin speed and a third open level, and so on, until the developing process is completed. The first switch open state is determined according to the first spin speed; the second switch open state is determined according to the second spin speed; and so on.

By the method 60 and the developing system 10 that the method 60 is implemented therein, the exhaust rate remains substantially same with tolerable variations. Thereby, it is eliminated or reduced the dry out of chemical at the edges of the substrate 14 (or wafer edges). Instead, the chemical in liquid is spun off from the wafer edges. Accordingly, the particle issue associated with the dry out of the chemical at the wafer edges is eliminated or reduced.

Figure 7:
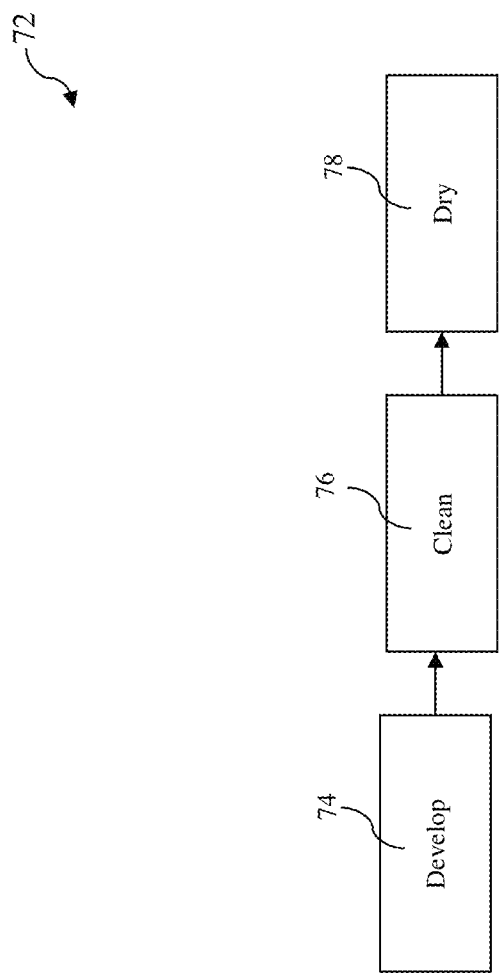
FIG. 7 is a block diagram of a developing procedure, constructed in accordance with some embodiments.

In some embodiments, the developing process includes multiple steps, such as those illustrated in FIG. 7 in a block diagram. The developing process 72 includes a developing step associated with a developing solution, a rinsing step associated with a rinsing solution and a drying step.

Back to FIG. 4, the method 60 may repeat the operations 64-68 with different chemical. For example, in a first step, a developing solution is applied to the substrate 14 at the operation 64. The substrate 14 is controlled to spin at a first spin speed in the operation 66 and the exhaust multi-switch mechanism 24 is set to a first switch open state according to the first spin speed in the operation 68. Both the first spin speed and the first switch open state are variable over the first step processing time as described above. When the method 60 proceeds to a second step, a rinsing solution is applied to the substrate 14 at the operation 64. The substrate 14 is controlled to spin at a second spin speed in the operation 66 and the exhaust multi-switch mechanism 24 is set to a second open state according to the second spin speed in the operation 68. As described above according to some embodiments, the first spin speed may be a variable, and then the first open state is also a variable dynamically set according to the first spin speed. Similarly, the second spin speed and the second open state may also be variables in a similar way. In some embodiments, the spin speed at a certain processing stage may be zero, in which the wafer is in static mode without spinning.

FIG. 8 is a flowchart of a method 80, constructed in accordance with some embodiments. The method 80 is described with reference to FIG. 8, FIG. 1 and other figures. The method 80 includes an operation 62 by loading a substrate 14 to the developing unit 10. Particularly, the substrate 14 is loaded to the substrate stage 12 of the developing unit 10. In the present embodiment, the substrate 14 is a semiconductor wafer coated with a resist layer.

The method 80 further includes an operation 82 by moving a chemical nozzle of the chemical supply mechanism 28 to the center of the wafer 14. In some embodiments, the chemical supply mechanism 59 includes multiple chemical nozzles, such as a first nozzle to provide a developing solution and a second nozzle to provide a rinsing solution. In this case, the corresponding chemical nozzle is moved to the wafer center.

The method 80 further includes an operation 84 by dispensing the chemical solution to the substrate 14 by the corresponding chemical nozzle. In some examples, the chemical to be delivered is a developing solution, such as TMAH. In some other examples, the chemical to be delivered is a rinsing solution, such as DIW.

The operation 84 also includes turning the exhaust multi-switch mechanism 24 to an open mode. Particularly, the exhaust multi-switch mechanism 24 is set to one of the switch open states. During the operation 84, the substrate 14 may spin or is in static without spinning.

The method 80 proceeds to an operation 86 that includes dynamically turning off the chemical supply mechanism from delivery of the chemical or turning on the chemical supply mechanism, while the exhaust multi-switch mechanism 24 is kept in the open mode.

The method 80 proceeds to an operation 88 that includes stopping to dispense the chemical solution to the substrate 14; and changing the switch open state to change the exhaust pressure; and changing the spin speed of the wafer for spin drying.

The method 80 proceeds an operation 90 that includes moving the chemical nozzle to the home position; stopping the wafer spinning; and turning off the exhaust multi-switch mechanism to the off state (close state).

By the method 80 and the developing system 10 where the method 80 is implemented therein, the exhaust rate remains substantially same with tolerable variations. Thereby, it is eliminated or reduced that the dry out of chemical at the edges of the substrate 14. Instead, the chemical in liquid is spun off from the wafer edges. Accordingly, the particle issue associated with the dry out of the chemical at the wafer edges is eliminated or reduced.

The present disclosure provides a developing unit and the method to implementing the same. The developing unit includes a multi-switch integrated in the exhaust mechanism. During a developing process, the multi-switch is set to one of multiple open states according to the spin speed of the wafer. The spin speed is a variable, and the setting of the multi-switch is also changed to a respective switch open state according to the spin speed such that the exhaust rate is maintained substantially stable. The present disclosure may include other embodiments or alternatives without depart of the spirit and the scope. For example, the developing unit may alternatively be a coating unit utilizing the multi-switch with similar configuration and functions, such as maintaining the exhaust rate and reducing the particle. The multi-switch is dynamically set to one of the switch open states according to the spin speed. However, the chemical supplied in the example is a flowable chemical to be formed as the resist layer on the wafer.

The embodiments of the present disclosure offer advantages over existing art, though it is understood that other embodiments may offer different advantages, not all advantages are necessarily discussed herein, and that no particular advantage is required for all embodiments. By the disclosed developing unit and the method to implement the same, the exhaust rate remains substantially same with tolerable variations. Thereby, it is eliminated or reduced that the dry out of chemical at the wafer edge. Instead, the chemical in liquid is spun off from the wafer edges. Accordingly, the particle issue associated with the dry out of the chemical at the wafer edges is eliminated or reduced.

Thus, the present disclosure provides a developing unit in accordance with some embodiments. The developing unit includes a wafer stage designed to secure a semiconductor wafer; an exhaust mechanism configured around the wafer stage and designed to exhaust a fluid from the semiconductor wafer; and a multi-switch integrated with the exhaust mechanism and designed to control the exhaust mechanism at various open states.

The present disclosure provides an apparatus in accordance with some embodiments. The apparatus includes a coating unit designed to coat a resist layer on a wafer; a developing unit designed to performing a developing process to the resist layer coated on the wafer; and a baking unit designed to apply a baking process to the resist layer coated on the wafer. The developing unit includes an exhaust mechanism and a multi-switch integrated with the exhaust mechanism, wherein the multi-switch has a plurality of open states.

The present disclosure provides a method in accordance with some embodiments. The method includes loading a wafer to a developing unit that includes an exhaust mechanism and a multi-switch integrated with the exhaust mechanism, wherein the multi-switch has a plurality of open levels; applying a first fluid to the wafer; spinning the wafer at a first spin speed; and setting the multi-switch to a first open state during the spinning of the wafer at the first spin speed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A developing unit, comprising:
a wafer stage configured to secure a wafer, wherein the wafer stage is further configured to spin the wafer at various spin speeds during a developing process;
a supply mechanism configured to deliver a liquid to the wafer;
a spin controller configured to control the various spin speeds of the wafer;
an exhaust mechanism configured to exhaust liquid spun off the wafer during the developing process;
a multi-switch mechanism integrated with the exhaust mechanism, wherein the multi-switch mechanism includes a plurality of open states that correspond with an exhaust rate of the liquid by the exhaust mechanism during the developing process; and
a multi-switch controller coupled with the multi-switch mechanism and the spin controller, wherein the multi-switch controller is configured to dynamically set the multi-switch mechanism to one of the plurality of open states based on a spin speed of the wafer stage, thereby stabilizing the exhaust rate of the liquid during the developing process.

2. The developing unit of claim 1, wherein the multi-switch mechanism includes a circle valve.

3. The developing unit of claim 2, wherein the multi-switch mechanism further includes a stepper motor integrated with the circle valve, wherein the stepper motor is operable to rotate the circle valve around its fixed center to set the circle valve to one of the plurality of open states or a closed state.

4. The developing unit of claim 1, further comprising a motor integrated with the wafer stage, wherein the motor drives the spinning of the wafer at the various spin speeds.

5. The developing unit of claim 1, wherein the multi-switch controller sets the multi-switch mechanism to the one of the plurality of open states according to a first signal that is from the spin controller and is associated with the spin speed.

6. The developing unit of claim 5, wherein the multi-switch controller generates a second signal to the multi-switch mechanism, thereby setting the multi-switch mechanism to the one of the plurality of open states as a function of the spin speed.

7. The developing unit of claim 1, wherein the multi-switch controller sets the multi-switch mechanism, such that an open state of the multi-switch mechanism is a step-wise function of the spin speed.

8. The developing unit of claim 1, wherein:
the wafer stage spins at more than one spin speed during the developing process; and
for each spin speed of the wafer, the multi-switch controller adjusts the multi-switch mechanism to one of the one of the plurality of open states based on the spin speed.

9. An apparatus, comprising:
a coating unit designed to coat a resist layer on a wafer;
a developing unit designed to perform a developing process to the resist layer coated on the wafer, wherein the developing unit includes:
a wafer stage for securing and spinning the wafer at more than one spin speed during the developing process,
a supply mechanism for providing a fluid to the wafer during the developing process,
a spin controller for controlling the more than one spin speed of the wafer during the developing process;
an exhaust mechanism for exhausting the fluid spun off the wafer during the developing process,
a multi-switch mechanism having various open states that correspond with an exhaust rate of the fluid by the exhaust mechanism during the developing process, and
a multi-switch mechanism controller coupled with the multi-switch mechanism and the spin controller, wherein for each spin speed of the wafer during the developing process, the multi-switch controller adjusts the multi-switch mechanism to one of the various open states based on the spin speed, thereby controlling the exhaust rate of the fluid; and
a baking unit designed to apply a baking process to the resist layer coated on the wafer.

10. The apparatus of claim 9, wherein the multi-switch mechanism includes a circle valve.

11. The apparatus of claim 10, wherein the multi-switch mechanism further includes a stepper motor integrated with the circle valve, wherein the stepper motor is operable to rotate the circle valve around its fixed center.

12. The apparatus of claim 9, wherein the developing unit further includes a motor integrated with the wafer stage, wherein the motor drives spinning of the wafer stage.

13. The apparatus of claim 9, wherein the multi-switch controller is configured to set the multi-switch mechanism to one of the plurality of open states in a manner that increases a threshold of the multi-switch mechanism as the spin speed decreases and decreases the threshold of the multi-switch mechanism as the spin speed increases.

14. The apparatus of claim 9, wherein an open state of the multi-switch mechanism is a step-wise function of the spin speed.

15. An apparatus, comprising:
a wafer stage configured to secure a wafer;
a spin controller configured to control a motion of the wafer stage;
an exhaust mechanism configured to exhaust a liquid spun off the wafer during a developing process, wherein the exhaust mechanism includes a multi-switch valve having a plurality of open states that correspond with an exhaust rate of the liquid; and
a multi-switch controller coupled with the multi-switch valve and the spin controller, herein the multi-switch controller sets the multi-switch valve to one of the plurality of open states based on a spin signal received from the spin controller, wherein the spin signal is associated with a spin speed of the wafer stage.

16. The apparatus of claim 15, further comprising a stepper motor integrated with the multi-switch valve, wherein the stepper motor is configured to control the multi-switch valve to set the multi-switch valve to the one of the plurality of open states.

17. The apparatus of claim 15, further comprising a motion mechanism integrated with the wafer stage, the motion mechanism configured to drive the wafer stage based on the spin signal.

18. The apparatus of claim 15, wherein the plurality of open states include a fully open state and various open states between a closed state and the fully open state.

19. The apparatus of claim 15, wherein the multi-switch controller is configured to set the multi-switch valve to one of the plurality of open states in a manner that increases a threshold of the multi-switch valve as the spin speed decreases and decreases the threshold of the multi-switch valve as the spin speed increases.

20. The apparatus of claim 15, wherein:
the spin controller varies the spin speed of the wafer stage during the developing process, such that the wafer stage spins at more than one spin speed; and
for each spin speed of the wafer, the multi-switch controller adjusts the multi-switch valve to one of the one of the plurality of open states.

* * * * *